United States Patent
Poulton

(10) Patent No.: US 9,343,449 B2
(45) Date of Patent: May 17, 2016

(54) ALTERNATIVE 3D STACKING SCHEME FOR DRAMS ATOP GPUS

(75) Inventor: John W. Poulton, Chapel Hill, NC (US)

(73) Assignee: NVIDIA Corporation, Santa Clara, CA (US)

( * ) Notice: Subject to any disclaimer, the term of this patent is extended or adjusted under 35 U.S.C. 154(b) by 777 days.

(21) Appl. No.: 13/543,583

(22) Filed: Jul. 6, 2012

(65) Prior Publication Data
US 2014/0009992 A1      Jan. 9, 2014

(51) Int. Cl.
*G11C 5/06* (2006.01)
*H01L 25/18* (2006.01)
*H01L 25/065* (2006.01)

(52) U.S. Cl.
CPC .......... *H01L 25/18* (2013.01); *H01L 25/0652* (2013.01); *H01L 2224/16145* (2013.01); *H01L 2224/16225* (2013.01); *H01L 2225/06513* (2013.01); *H01L 2225/06517* (2013.01); *H01L 2225/06527* (2013.01); *H01L 2225/06541* (2013.01); *H01L 2924/15151* (2013.01); *H01L 2924/15311* (2013.01)

(58) Field of Classification Search
CPC .............. G11C 5/06; G11C 5/02; G11C 5/04; G11C 7/10
USPC .............................. 365/63, 40, 149
See application file for complete search history.

(56) References Cited

U.S. PATENT DOCUMENTS

| | | |
|---|---|---|
| 2004/0257847 A1 | 12/2004 | Matsui |
| 2005/0099834 A1 | 5/2005 | Funaba et al. |
| 2005/0139977 A1 | 6/2005 | Nishio et al. |
| 2006/0197220 A1* | 9/2006 | Beer .................. H01L 21/486 257/723 |
| 2007/0263425 A1* | 11/2007 | Ruckerbauer ........... G11C 5/02 365/149 |
| 2009/0103345 A1 | 4/2009 | McLaren et al. |
| 2009/0161402 A1* | 6/2009 | Oh .......................... G11C 5/02 365/51 |
| 2009/0177833 A1 | 7/2009 | Norman |
| 2011/0171582 A1 | 7/2011 | Farooq et al. |
| 2011/0309475 A1 | 12/2011 | Lee |
| 2012/0043664 A1 | 2/2012 | Coteus et al. |

(Continued)

FOREIGN PATENT DOCUMENTS

| | | |
|---|---|---|
| CN | 101542628 A | 9/2009 |
| CN | 102341907 A | 2/2012 |

(Continued)

OTHER PUBLICATIONS

United Kingdom Combined Search and Examination Report dated Nov. 1, 2013, Application No. GB1311388.1, 7 pages.

*Primary Examiner* — Tuan T Nguyen
(74) *Attorney, Agent, or Firm* — Artegis Law Group, LLP

(57) ABSTRACT

Embodiments of the invention provide an integrated circuit system, which includes a first supporting substrate and a second supporting substrate, a logic chip disposed between the first supporting substrate and the second supporting substrate, and a plurality of memory stacks disposed adjacent to one another on a surface of the logic chip. The logic chip is separated from the first supporting substrate and the second supporting substrate by a distance such that at least a portion of a first memory stack in the plurality of memory stacks extending outwards past a first side edge of the logic chip is supported by the first supporting substrate, and at least a portion of a second memory stack in the plurality of memory stacks extending outwards past a second side edge of the logic chip that is opposite to the first side edge is supported by the second supporting substrate.

15 Claims, 4 Drawing Sheets

(56) References Cited

U.S. PATENT DOCUMENTS

| | | | |
|---|---|---|---|
| 2014/0192583 A1* | 7/2014 | Rajan | G11C 7/10 365/63 |
| 2014/0246788 A1* | 9/2014 | Kim | H01L 25/0657 257/777 |
| 2015/0085559 A1* | 3/2015 | Lee | G11C 13/0007 365/148 |

FOREIGN PATENT DOCUMENTS

| | | |
|---|---|---|
| EP | 0849738 A2 | 6/1998 |
| GB | 2354881 A | 4/2001 |
| JP | 2002369286 A | 12/2002 |
| TW | 201209842 A | 3/2012 |
| TW | 201227878 A | 7/2012 |

* cited by examiner

ALTERNATIVE 3D STACKING SCHEME FOR DRAMS ATOP GPUS

BACKGROUND OF THE INVENTION

1. Field of the Invention

Embodiments of the present invention relate generally to integrated circuit chip packaging and, more specifically, to a three-dimensional chip packages.

2. Description of the Related Art

Computers and other electronic products use memory devices to store data and other information. In order to increase the amount of memory provided in a limited space, some memory devices have multiple semiconductor dice vertically arranged in a stack. Stacking memory chips is conventionally used to increase the capacity of a memory device while reducing I/O signaling power. One of the stacking approaches is System-in-Package (SiP), where a number of integrated circuits are enclosed in a single package or module. In the SiP, a number of integrated circuits are vertically stacked and are connected using conventional off-chip fine wires that are bonded to the package. Alternatively, with a flip-chip technology, solder bumps are used to join stacked chips together. This stacking approach allows higher density with reduced substrate footprint.

Recently, three-dimensional integrated circuits (3D IC) have been developed for improving the integration of the circuit components. 3D IC includes two or more layers of active electronic components integrated both vertically and horizontally into a single circuit. Unlike SiP, a 3D IC circuit may connect stacked semiconductor devices, such as memory devices, to a logic chip or other supporting substrate using vertical through-silicon vias (TSVs) running through the memory devices. TSV technology can be used for stacking a series of memory devices and provides a signal and/or heat path between the devices with shortened interconnect length and reduced power consumption by the memory devices.

One of the difficulties with TSV technology is the fairly limited memory capacity afforded by the memory devices stacked on logic chips. In cases where the logic chip is a graphics processing unit (GPU) chip 102 having a size of approximately 500 mm$^2$ and the memory device is a planar dynamic random-access-memory (DRAM) chip 104 with an area of approximately 100-200 mm$^2$ (as shown in FIGS. 1A and 1B), the size of the typical GPU chip 102 can only accommodate up to 4 stacks of 4 DRAM chip 104 (each DRAM chip 104 having a storage capacity of 256 Mbit) in order to create a total memory capacity of approximately 4 GBytes. The maximum frame buffer memory capacity is therefore limited to 4 GBytes due to limited size of the GPU chip.

Although TSV technology has been used to increase the data storage capacity of a memory device, the maximum memory capacity is still limited to a given size of the underlying logic chip supporting the memory devices. While a larger logic chip may increase the space for more stacked memory devices, the overall cost is increased accordingly.

As the foregoing illustrates, there is a need in the art for a cost-effective package system having a greater density of integrated circuits.

SUMMARY OF THE INVENTION

One embodiment of the present invention provides an integrated circuit system, which generally includes a first and second supporting substrates, a logic chip sandwiched directly between the first and second supporting substrates, and a plurality of memory stacks disposed side by side on a surface of the logic chip. The logic chip may be separated from the first and second supporting substrates by a distance such that at least a portion of memory stacks extends past side edges of the logic chip and is supported by the first and second supporting substrates.

One advantage of the disclosed system is that it results in about a 50% increase in both memory capacity and interconnection bandwidth by virtue of the additional columns of stacked memory devices partially supported on a supporting substrate (separated from a logic chip) and their associated TSVs running through the body of the memory devices. The disclosed stacking arrangement achieves the mechanical effect of a very large die to support stacked DRAM devices at a more affordable die size for the logic chip. In addition, the area of the supporting substrate not covered by the stacked memory devices may provide a heat path to transfer heat generated by the logic chip to an overlying heat sink that is in contact with the tops of the memory devices. Therefore, the thermal transmittance of the IC system is enhanced.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. In addition, the illustration in the appended drawings is not drawn to scale and is provided for illustration purpose.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the invention provide an integrated circuit system having one or more memory devices arranged in a stack (or a plurality of stacks) on a top surface of a logic chip. Each of the memory devices is connected to the logic chip by electrically conductive vertical vias running through the body of the memory devices. In various embodiments, the logic chip is configured to accommodate at least two or more columns of stacked memory devices, with at least a portion of edge columns of stacked memory devices extending outwards past the sides of the logic chip. In one embodiment, the portions of the edge columns extending out are supported by a supporting substrate that is separated from the logic chip. The supporting substrate may have the same thickness as the logic chip, and may be a relatively long, narrow piece of silicon or any other suitable material capable of providing mechanical strength/support for the stacked memory devices. The supporting substrate may or may not contain an active region to provide logical or electrical function for the system. Alternatively, the supporting substrate may be part of the logic chip where an inactive region is located (i.e., the region of the logic chip that would otherwise be wasted).

The proposed stacking arrangement of the present invention advantageously provides about 50% or more stackable memory devices on top of a logic chip. Therefore, a greater density of stacked memory devices is obtained in a given space of logic chip. The inventive stacking arrangement achieves a mechanical effect of a very large die to support stacked DRAM devices at a more affordable die size for the logic chip. Details of the invention are discussed in greater detail below.

Figure 1A:
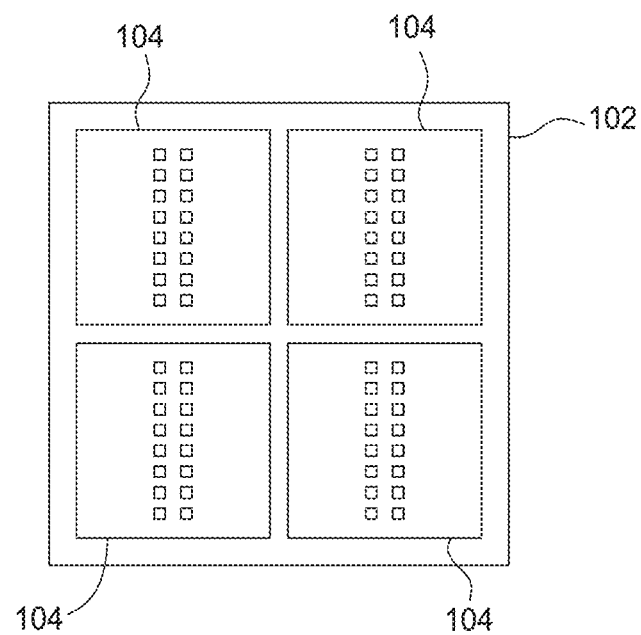
FIG. 1A is a schematic top view of an integrated circuit (IC) system showing memory stacks arranged in a conventional stacking approach.
Figure 1B:
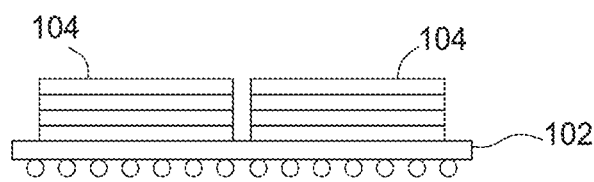
FIG. 1B is a schematic cross-sectional view of the IC system of FIG. 1A.
Figure 2A:
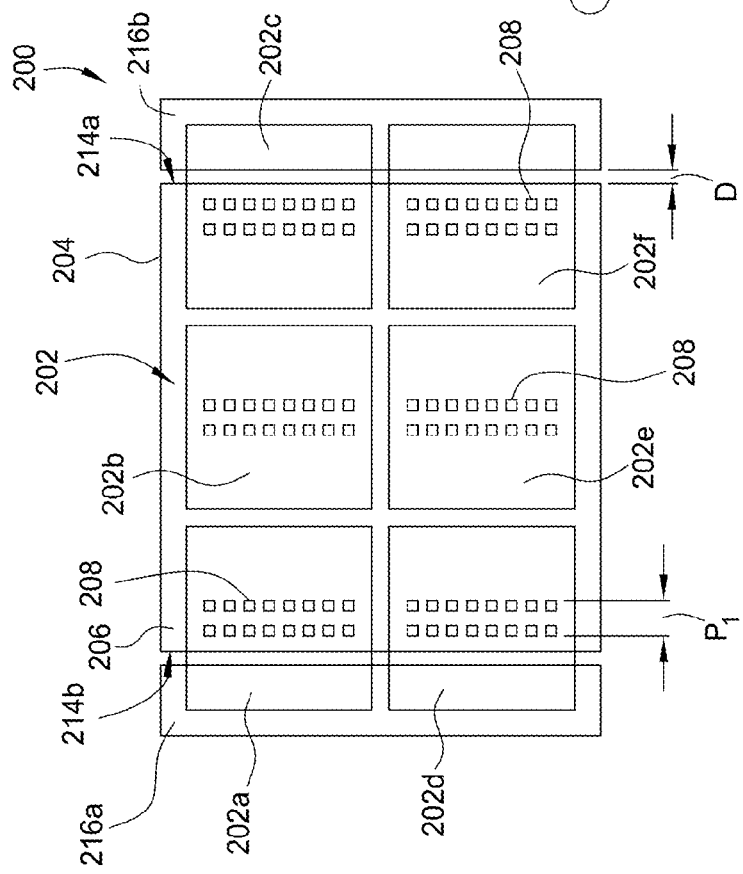
FIG. 2A is a schematic planar view of an exemplary IC system, according to one embodiment of the invention.

FIG. 2A illustrates a schematic planar view of an exemplary integrated circuit (IC) system 200 according to one embodiment of the invention. The system 200 may include a semiconductor device 202 disposed on a top surface of a logic chip 204. The semiconductor device 202 may include one or more die stacks disposed in a planar manner (side by side), where each die stack comprises n number of dies, where n is ≥2. The semiconductor device 202 may be a memory device such as a dynamic random access memory (DRAM), a static random access memory (SRAM), or various types of non-volatile memories including programmable read-only memories (PROM) and flash memories etc. The logic chip may be a graphics processing unit (GPU), a central processing unit (CPU), an application processor or any IC chip that provides some sort of processing capability. In one embodiment shown in FIG. 2A, the semiconductor device 202 generally includes six DRAM stacks 202a-202f, each stack having four DRAM devices $205_1$, $205_2$, $205_3$, $205_4$ stacked vertically on top of one another (FIG. 2B), configured in a 3×2 array arrangement on the top surface 206 of the logic chip 204, which is a GPU chip in one example. Note that although four DRAM devices are described, the DRAM stack may be configured with fewer or more chips depending upon the amount of memory desired for a system.

Each DRAM device $205_1$-$205_4$ may have a memory capacity of 256 Mbit, although DRAM devices with more or less memory capacity may be implemented. Similarly, the size of the logic chip 204 or DRAM devices may be adjusted in accordance with the present invention (will be discussed below) to provide a greater or lesser density of DRAM stacks.

Figure 2B:
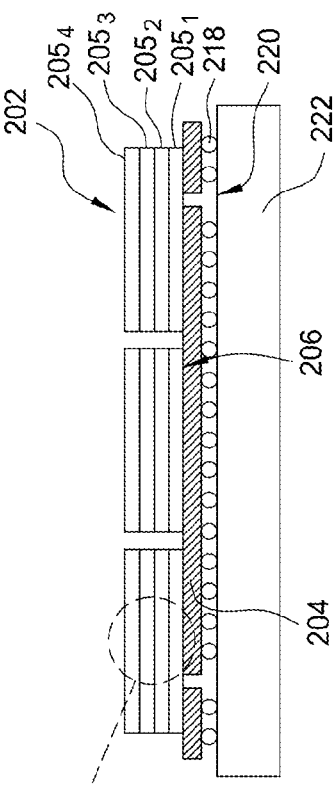
FIG. 2B is a schematic cross-sectional view of the IC system of FIG. 2A.
Figure 2C:
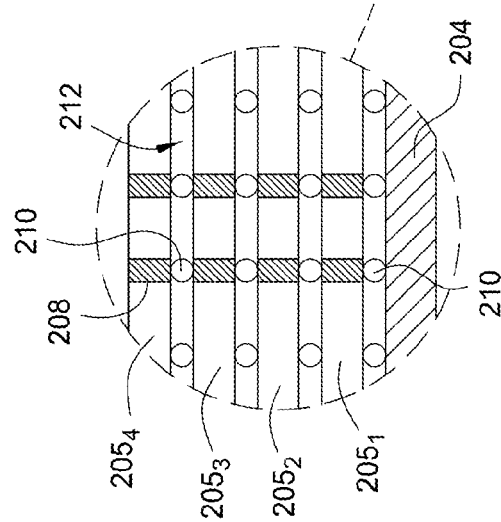
FIG. 2C is an enlarged, fragmentary sectional view of FIG. 2B showing electrical connections between DRAM devices and a logic chip.

Each of the DRAM devices $205_1$-$205_4$ in the stack is electrically connected using vertical conductive vias 208 that penetrate the DRAM devices $205_1$-$205_4$. The vertical conductive vias 208 may be arranged in two vertical rows at the center of each stacked DRAM device, as shown in FIG. 2A, with a pitch "P1" of vertical conductive vias 208 ranging between about 20 μm and about 150 μm, although in practical design, pitch "P1" may be greater or smaller depending upon application. FIG. 2c is an enlarged, fragmentary sectional view of FIG. 2B showing vertical conductive vias 208 running through the body of the DRAM devices $205_1$-$205_4$, such as from one surface of the DRAM device $205_1$ to another surface of the DRAM device $205_2$. When silicon technology is used, these vertical conductive vias 208 may be referred to as through-silicon vias (TSV). The vertical conductive vias 208 form a conductive path running through the DRAM devices $205_1$-$205_4$ to effectively provide vertical electrical connections (such as power, ground, and signal interconnections) between the semiconductor device 202 (i.e., the DRAM devices $205_1$-$205_4$) and the logic chip 204 through electrical connections 210. Therefore, vertical conductive vias 208 provide very short path-length interconnects between the DRAM devices $205_1$-$205_4$ and the logic chip 204. While not discussed here, it is appreciated that the vertical conductive vias 208 may be formed by wet or dry etch process and filled with a conductive metal.

The electrical connections 210 are generally provided between two adjacent DRAM devices to facilitate electrical connections between DRAM devices that are vertically stacked. The electrical connections 210 are also provided between the DRAM device and the logic chip 204 for the same purpose. The electrical connections 210 may be made using any technically feasible approach known in the art, including but not limiting to solder bumps. The solder bumps may be comprised of copper or another conductive material, such as aluminum, gold, silver, or alloys of two or more elements. The solder bumps may be bonded to contact areas or pads (not shown) formed on the surface of the DRAM device and the logic chip. The logic chip 204 with stacked DRAM devices is then mounted on a surface 220 of the packaging substrate 222. The logic chip 204 is therefore electrically connected to the packaging substrate 222 via electrical connections 218, which may be any suitable conductive means such as solder bumps.

The stacking of the DRAM devices $205_1$-$205_4$ can be achieved by, for example, providing a second DRAM device $205_2$ on top of a first DRAM device $205_1$ such that the vertical conductive vias 208 formed in the first and second DRAM devices $205_1$, $205_2$, and the electrical connections 210 between DRAM devices $205_1$, $205_2$ are aligned (FIG. 2C). In cases where solder bumps are used, reliability of the electrical connections 210 may be improved by protecting the solder bumps with an encapsulant material 212. The encapsulant material 212 may be a resin, such as epoxy resin, acrylic resin, silicone resin, polyurethane resin, polyamide resin, polyimide resin, etc. Alternatively, the cavity between the DRAM devices can be filled with an underfill material to protect the electrical connections 210. Various types of underfill materials, such as materials which include max fillers, moldable underfills, epoxy mold compound or epoxy can be used. Further DRAM devices may be stacked on top of the second DRAM device $205_2$ in the same manner.

Referring back to FIG. 2A, the IC system 200 has six DRAM stacks 202a-202f configured in a 3 (column)×2 (row) array arrangement on the top surface 206 of the logic chip 204. Particularly, the DRAM stacks are arranged in a manner that at least two columns of DRAM stacks are offset from a center of the logic chip 204, allowing a portion of the two edge columns of DRAM stacks to overlap the edge of the logic chip 204 on both sides when viewing from a top view, or in a viewing axis "M" normal to the top surface 206 of the logic chip 204. Specifically, the middle column DRAM stack (e.g., DRAM stacks 202b, 202e), which is sandwiched between two edge columns of DRAM stacks (e.g., DRAM stacks 202a, 202d and 202c, 202f), is fully supported by the underlying logic chip 204, while a portion of edge columns of DRAM stacks 202a, 202d and 202c, 202f extends outwards past the sides 214a, 214b, respectively, of the logic chip 204. The vertical conductive vias may be arranged within side edges of the logic chip 204 when viewing from the top view.

The portions of the edge columns of DRAM stacks 202a, 202d and 202c, 202f extending out may be supported on supporting substrates 216a and 216b, respectively. Therefore, the supporting substrate 216a provides or enhances mechanical strength to edge portions of DRAM stacks 202a, 202b while the supporting substrate 216b provides or enhances mechanical strength to edge portions of DRAM stacks 202c, 202f. In addition, the area of the supporting substrates 216a, 216b that is not covered by the edge columns of DRAM stacks may also be used to conduct heat generated by the logic chip 204 and/or DRAM stacks during operation to a heat sink or other cooling mechanism, which may be placed over and in contact with the tops of the DRAM stacks. Therefore, the thermal conductance of the system is enhanced. While not shown, it is contemplated that the heat sink may be of any desired shape and made of any material capable of conducting and dissipating heat generated from the logic chip, DRAM stacks or the system.

The supporting substrates 216a, 216b may or may not be physically separated from the logic chip 204. In one embodiment, the supporting substrates 216a, 216b is distinct or physically separated from the logic chip 204 by a desired distance "D". In cases where the logic chip 204 has a size of approximately 500 mm$^2$ and the DRAM device has a surface area of approximately 100-200 mm$^2$, the distance "D" may be between about 0.01 mm and about 10 mm, for example about 2 mm to about 5 mm. However, it is contemplated that the distance "D" on both sides of the logic chip 204 may be identical or different. The supporting substrates 216a, 216b may be made of silicon or an insulating material such as glass or composite polymer, or any other suitable material that is capable of providing mechanical strength/support for the DRAM stacks extending outwards pass the side of the logic chip 204. If desired, the supporting substrates 216a, 216b may be fabricated in the same process as the logic chip 204. In various embodiments, the supporting substrates 216a, 216b may be configured to cover approximately 15%-45% of the surface area of the DRAM stacks 202a, 202b and 202c, 202f, respectively. The supporting substrates 216a, 216b may be formed of a relatively long, narrow piece of silicon to provide a surface area sufficient to cover portions of the edge columns of DRAM stacks 202a, 202d and 202c, 202f extending outwards pass the sides of the logic chip 204. In cases where the DRAM device, for example, DRAM device 202a, has a dimension of approximately 10 (length)×10 (width) mm, the supporting substrate 216a may be arranged to cover at least about 2 mm to about 5 mm width of the DRAM device 202a, measuring from an edge of the DRAM device 202a. If desired, the supporting substrates 216a, 216b may have the same length and thickness as the logic chip 204. For example, the logic chip 204 and the supporting substrates 216a, 216b may have a thickness of about 0.5 mm to about 0.8 mm. The supporting substrates 216a, 216b may each contain an active circuitry providing a different logical or electrical function to the system, depending upon the application. In one example, the supporting substrates 216a, 216b simply provide mechanical strength to the DRAM stacks and contain no active circuitry.

Figure 3A:
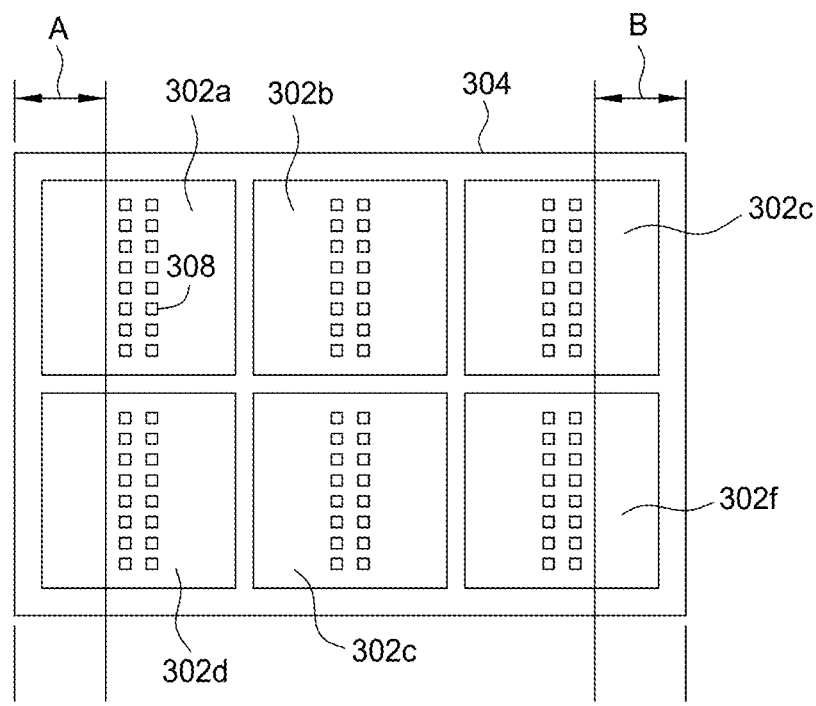
FIG. 3A is a schematic planar view of an exemplary IC system, according to another embodiment of the invention.
Figure 3B:
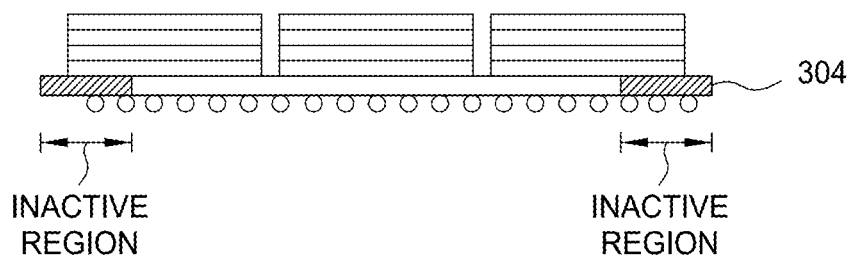
FIG. 3B is a schematic cross-sectional view of the IC system of FIG. 3A.

FIG. 3A illustrates a schematic planar view of an exemplary integrated circuit (IC) system 300 according to another embodiment of the invention. In this embodiment, the number and arrangement of DRAM stacks are identical to the embodiment shown in FIG. 2A, except that the supporting substrates and the logic chip are formed as a whole unit. For example, the size of the logic chip 304 may be fabricated relatively larger than the overall size or surface area of DRAM stacks 302a-302f occupied on the logic chip 304. In cases where six DRAM stacks 302a-302f are disposed on the top surface of the logic chip 304 in a 3 (column)×2 (row) array arrangement, the edge areas "A" and "B" of the logic chip 304 may be an inactive region (a region containing no active function) which simply provides mechanical support for the edge columns of DRAM stacks 302a, 302d and 302c, 302f. In other words, the edge columns of DRAM stacks 302a, 302b and 302c, 302f are supported by an area of the logic chip that would otherwise be wasted. FIG. 3B illustrates a schematic cross-sectional view of the IC system 300 of FIG. 3A, conceptually showing portions of edge columns of DRAM stacks 302a, 302d and 302c, 302f are supported by the inactive region of the logic chip 304. It is contemplated that the edge areas "A" and "B" may vary in size depending upon the number of DRAM stacks provided and/or the location of the vertical conductive vias 308 formed in the DRAM devices. The inventive stacking arrangement therefore achieves the mechanical effect of a very large die to support stacked DRAM devices at a more affordable die size for the logic chip.

Figure 4:
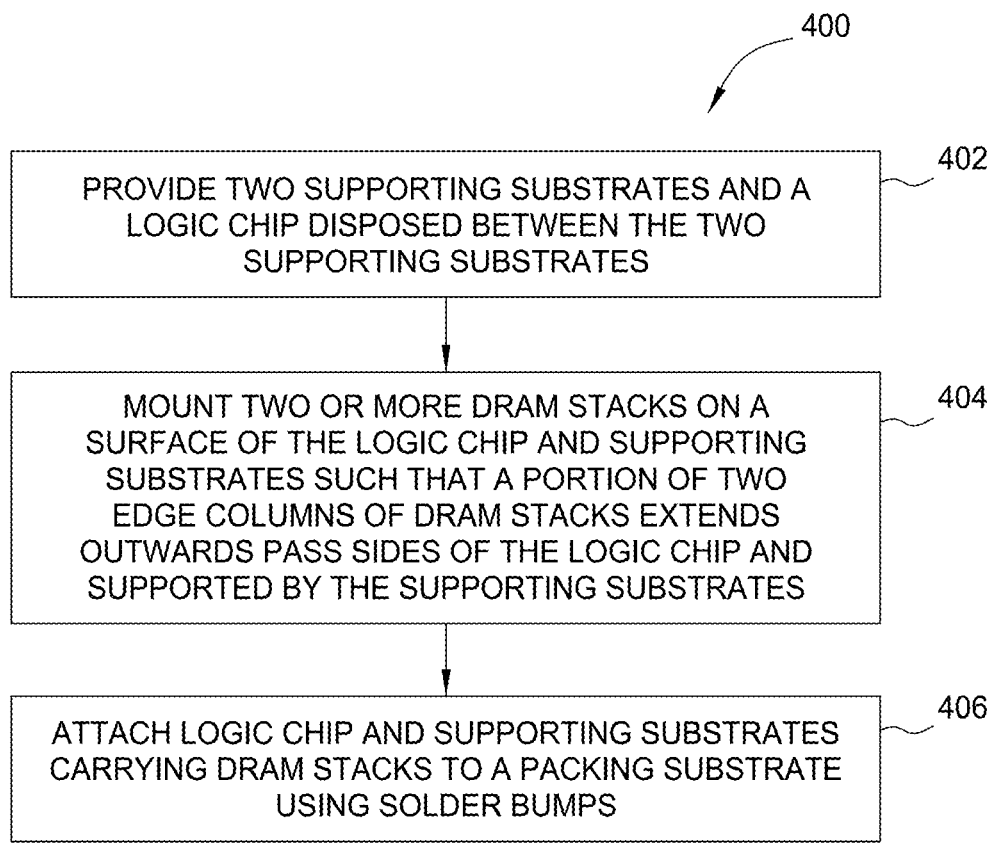
FIG. 4 illustrates an exemplary process sequence used to form an integrated circuit (IC) system, according to one embodiment of the invention.

FIG. 4 illustrates an exemplary process sequence 400 used to form an integrated circuit system, such as IC system 200 or 300 of FIG. 2A or 3A, according to one embodiment of the invention. It should be noted that the number and sequence of steps illustrated in FIG. 4 are not intended to be limiting as to the scope of the invention described herein, since one or more steps may be added, deleted and/or reordered without deviating from the basic scope of the invention.

The process sequence 400 starts at step 402 by providing two supporting substrates and a logic chip disposed between the two supporting substrates. The logic chip, such as a GPU chip, may have a dimension of about 22 mm×22 mm. The supporting substrate may be formed of a relatively long, narrow piece of silicon that has the same length and thickness as the GPU chip. The GPU chip and the supporting substrates are separated by a desired distance of about 0.5 mm to about 2 mm. The GPU chip and the supporting substrates may have an array of bump contacts, such as microbumps or C4 bumps, formed thereon.

In step 404, two or more DRAM stacks, such as DRAM stacks discussed above with respect to FIGS. 2A-2C, are mounted face-side down on the front surface of the GPU chip and the supporting substrates where bump contacts are formed. The term "face side" denotes the side of the DRAM devices that is treated with semiconductor processing such that circuitry is fabricated on that face side of the DRAM devices. In one embodiment, the DRAM stacks are arranged in a 3×2 array configuration, with a middle column of DRAM stacks sandwiched between two edge columns of DRAM stacks. Particularly, the two edge columns of DRAM stacks are configured such that a portion of each of the edge DRAM stacks is extended outwards pass the side of the GPU chip and supported by the supporting substrates, as discussed above with respect to FIGS. 2A-2C.

The stacked DRAM devices, as discussed above, have vertical conductive vias running through the body of DRAM device to electrically connect the DRAM devices to the GPU chip. The stacked DRAM devices are placed on the GPU chip and the supporting substrates, with the bump contacts in contact with the vertical conductive vias of the DRAM device immediately disposed on the GPU chip. The bump contacts are then heated and reflowed to form solder joints. These solder joints are in alignment with the vertical conductive vias of the DRAM devices and are configured to provide an electrical and mechanical connection between the DRAM devices and the GPU chip. If desired, the solder joints or the cavity between the DRAM devices and the GPU chip may be encapsulated in an encapsulant material using an underfill process. The encapsulant material structurally couples the stacked DRAM devices to the GPU chip and prevents or limits differential movement of the stacked DRAM devices and the GPU chip during thermal cycling. The high stiffness of the encapsulant material also enables the encapsulant material to accommodate the thermal stresses that would otherwise act on the solder joints.

In step 406, the GPU chip and the supporting substrates carrying DRAM stacks are attached to a packaging substrate by their back sides using solder bumps. Solder bumps are then reheated or reflowed to metallurgically and electrically bond the DRAM stacks to the packaging substrate. The packaging substrate may be electrically connected to a printed circuit board (PCB) through conductive means to provide electrical communications between stacked DRAM devices, GPU chip, and the PCB. It is contemplated that the packaging substrate may be a laminate substrate comprised of a stack of insulative layers. The packaging substrate may have conductive lines running horizontally or vertically within the packaging substrate to provide power, ground and/or input/output (I/O) signal interconnections between DRAM devices, GPU chip and the PCB. The packaging substrate therefore provides the IC system with structural rigidity as well as an electrical interface for routing input and output signals and power within the IC system. A heat sink may be further placed over and supported by the stacked DRAM devices to enhance the thermal transmittance of IC system. It is contemplated that the heat sink may be of any desired shape and made of any material capable of conducting and dissipating heat generated from the IC system.

While the foregoing is directed to embodiments of the present invention, other and further embodiments of the invention may be devised without departing from the basic scope thereof. The scope of the different embodiments is determined by the claims that follow.

The invention claimed is:

1. An integrated circuit system, comprising:
    a first supporting substrate and a second supporting substrate;
    a logic chip disposed between the first supporting substrate and the second supporting substrate, the logic chip being separated from the first supporting substrate and the second supporting substrate by a distance; and
    a plurality of memory stacks disposed adjacent to one another on a surface of the logic chip, wherein at least a portion of a first memory stack in the plurality of memory stacks extending outwards past a first side edge of the logic chip is supported by the first supporting substrate, and at least a portion of a second memory stack in the plurality of memory stacks extending outwards past a second side edge of the logic chip that is opposite to the first side edge is supported by the second supporting substrate.

2. The system of claim 1, wherein the memory stacks included in the plurality of memory stacks are arranged in a 3×2 array configuration.

3. The system of claim 1, wherein each memory stack in the plurality of memory stacks comprises two or more memory devices stacked vertically on top of one another.

4. The system of claim 3, wherein at least one of the memory devices included in the two or more memory devices comprises a dynamic random access memory (DRAM) and the logic chip comprises a graphics processing unit (GPU).

5. The system of claim 3, wherein each memory device included in the two or more memory devices includes one or more electrical conductive vias running vertically through the memory device.

6. The system of claim 5, wherein the one or more electrical conductive vias are arranged within side edges of the logic chip.

7. The system of claim 1, wherein the first supporting substrate and the second supporting substrate each has an active circuitry providing logical or electrical function to the system.

8. The system of claim 7, wherein the first supporting substrate and the second supporting substrate each provides a different logical or electrical function to the system.

9. The system of claim 1, wherein the first supporting substrate and the second supporting substrate support 15%-45% of the surface area of the plurality of memory stacks.

10. The system of claim 1, wherein the first supporting substrate and the second supporting substrate comprise silicon.

11. The system of claim 1, wherein the distance ranges between about 0 mm and about 10 mm.

12. The system of claim 1, wherein the first supporting substrate and the second supporting substrate have approximately the same thickness as the logic chip.

13. An integrated circuit system, comprising:
    a logic device; and
    a plurality of memory stacks disposed on a surface of the logic device,
        wherein memory stacks included in the plurality of memory stacks are arranged such that at least a portion of a first memory stack included in the plurality of memory stacks is supported by a first inactive region of the logic device and at least a portion of a second memory stack included in the plurality of memory stacks is supported by a second inactive region of the logic device that is opposite to the first inactive region.

14. The system of claim 13, wherein the memory stacks included in the plurality of memory stacks are arranged in a 3×2 array configuration, and each memory stack in the plurality of memory stacks comprises two or more memory devices stacked vertically on top of one another.

15. The system of claim 13, wherein the inactive regions support 15%-45% of the surface area of the plurality of memory stacks.

* * * * *